United States Patent [19]

Hoffman

[11] Patent Number: 5,541,806
[45] Date of Patent: Jul. 30, 1996

[54] DUAL CURRENT SENSING DRIVER CIRCUIT WITH SWITCHING ENERGIZATION AND FLYBACK CURRENT PATHS

[75] Inventor: John P. Hoffman, Peoria, Ill.

[73] Assignee: Caterpillar Inc., Peoria, Ill.

[21] Appl. No.: 283,758

[22] Filed: Aug. 1, 1994

[51] Int. Cl.$^6$ .................................................. H01H 47/32
[52] U.S. Cl. ........................... 361/160; 361/154; 361/159
[58] Field of Search ...................................... 361/152, 154, 361/159, 160; 363/21

[56] References Cited

U.S. PATENT DOCUMENTS

| 4,661,766 | 4/1987 | Hoffmann et al. ................... 361/160 X |
| 4,949,215 | 8/1990 | Studtmann et al. ................. 361/160 X |
| 4,967,309 | 10/1990 | Hoffman ................................. 361/160 |
| 5,134,537 | 7/1992 | Buss et al. ................................ 361/154 |

*Primary Examiner*—Fritz M. Fleming
*Attorney, Agent, or Firm*—James R. Yee; Mario J. Donato

[57] ABSTRACT

A driver circuit for controllably connecting an inductive load to a source of electrical power in response to an input control signal is provided. The inductive load includes an inductive winding of a solenoid. The driver circuit controllably connects and disconnects the inductive load to and from the source in response to a first control signal and controllably provides a discharge path for a flyback current of the inductive load in response to a second control signal. The driver circuit senses both the energizing current and the flyback current and responsively provides an energization path and a flyback discharge path in a non-overlapping manner.

4 Claims, 2 Drawing Sheets

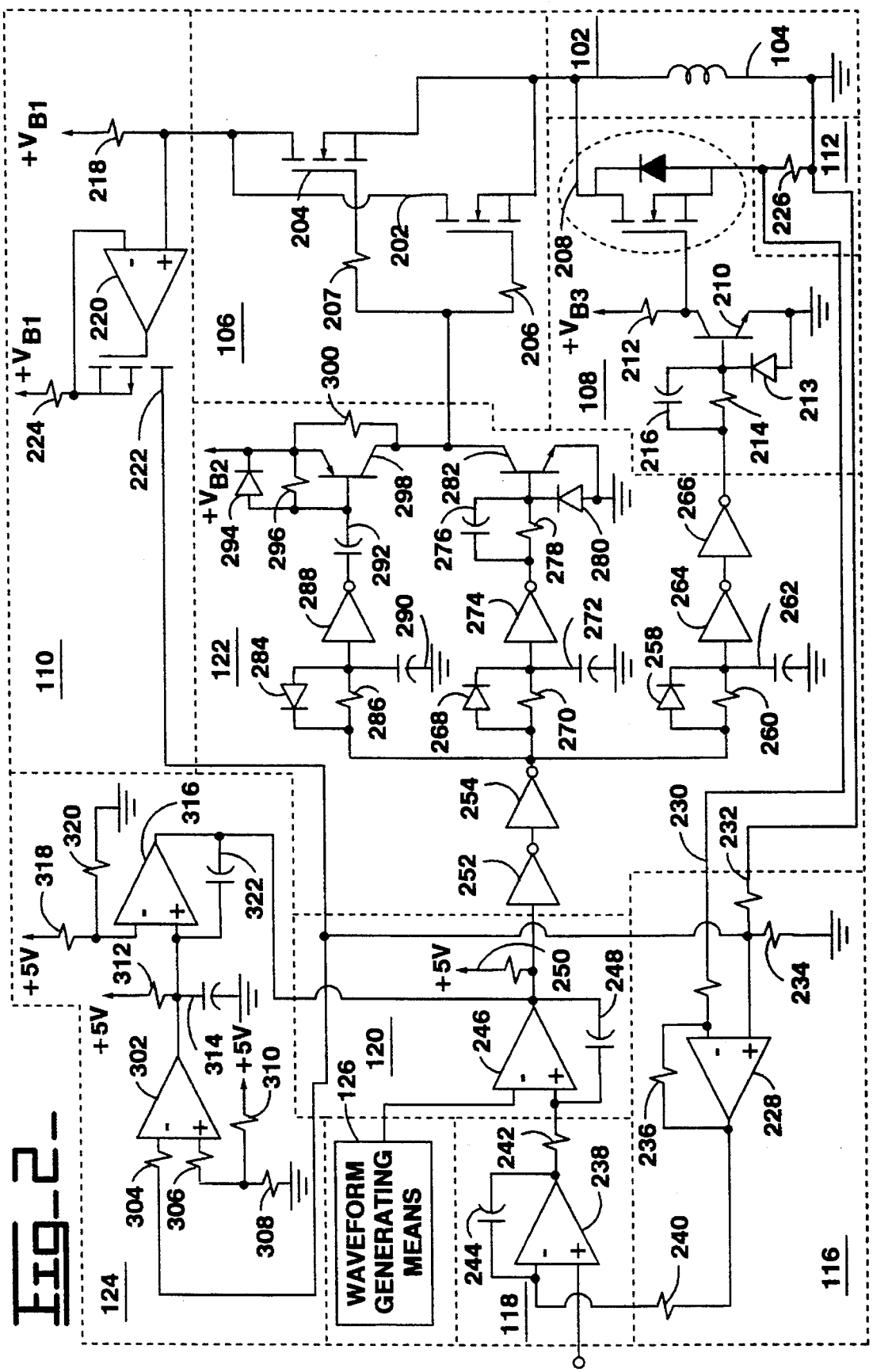

5,541,806

DUAL CURRENT SENSING DRIVER CIRCUIT WITH SWITCHING ENERGIZATION ANDFLYBACK CURRENT PATHS

TECHNICAL FIELD

This invention relates generally to a driver circuit for controlling the magnitude of current supplied to a winding of an inductive load, such as a solenoid, and more particularly, to a driver circuit which controllably provides an energization current path and a flyback current path.

BACKGROUND ART

In the field of driver circuits, there are many variations in solenoid driver circuitry used in industry today. The majority of these includes means for sensing the solenoid current to regulate the current in a closed loop system. In addition, most driver circuits use pulse-width modulation (PWM), or a variation thereof, to achieve a desired current delivered to a load.

In PWM driver circuits, the load is connected and disconnected from a power source according to a control signal. The control signal has a duty cycle proportional to the desired current. To vary the desired current, the duty cycle of the control signal is varied.

When the driver suddenly disconnects an inductive load from its power source, the current flow must continue. If no provisions are made, said current will produce destructive voltage spikes.

A majority of drivers place a flyback diode in parallel with the load. The flyback diode creates a path for the discharge of the flyback current. Generally, when the load is being energized, i.e., it is connected to the power source, the flyback diode is reverse biased by a positive voltage from the power source and no current flows through the diode. In other words, all current flows through the load. However, when the load is disconnected from the power source, the flyback diode provides a discharge current path to prevent the occurrence of large voltage spikes.

One disadvantage of this arrangement is that the diode may dissipate more power than desired during the flyback stage.

The present invention is directed to overcoming one or more of the problems, as set forth above.

DISCLOSURE OF THE INVENTION

In one aspect of the present invention, an apparatus, or driver circuit, for controllably connecting an inductive load to a source of electrical power ($+V_B$) in response to an input control signal, is provided. The inductive load, preferably includes an inductive winding of a solenoid. The driver circuit senses the magnitude of both an energization current and a flyback current and controllably connects and disconnects an energization path and a flyback current path.

In another aspect of the present invention, an apparatus, or driver circuit, for controllably connecting an inductive load to a source of electrical power ($+V_B$) in response to an input control signal is provided. The inductive load comprises an inductive winding of a solenoid. The driver includes at least one MOSFET connected between the inductive load and the source of electrical power. A second MOSFET is connected in parallel with the inductive load and forms a flyback current discharge path. The driver senses the magnitude of both an energization current and a flyback current and controllably connects and disconnects an energization path and a flyback current path.

BRIEF DESCRIPTION OF THE DRAWINGS

FIG. 2 is a detailed schematic of the block diagram of FIG. 1, according to an embodiment of the present invention.

BEST MODE FOR CARRYING OUT THE INVENTION

Figure 1:
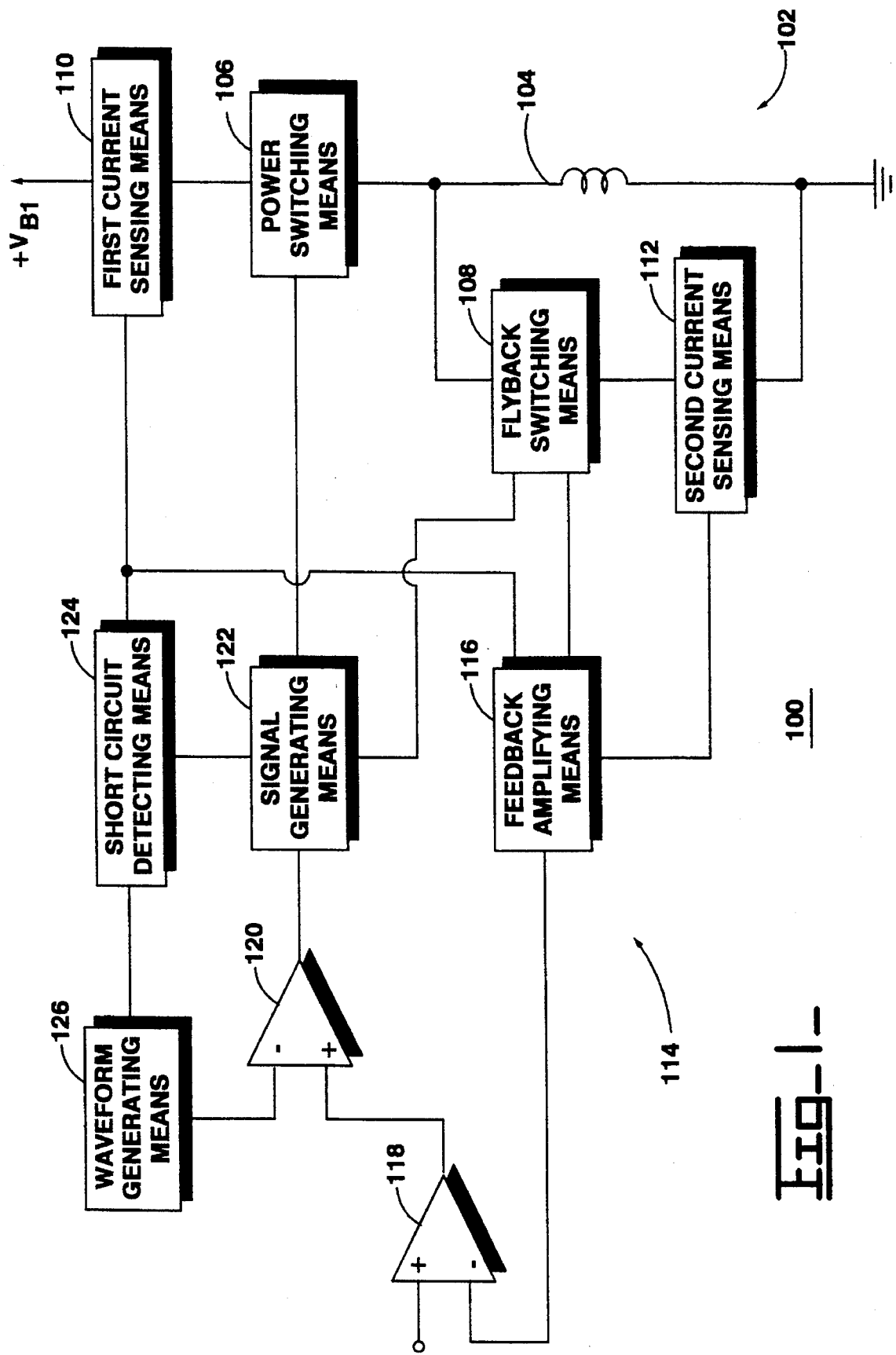
FIG. 1 is a block diagram of an embodiment of the present invention.

With reference to FIGS. 1 and 2, the present invention or driver circuit 100, controllably provides current of a predetermined magnitude to an inductive load 102. Preferably, the driver circuit 100 is used to actuate a solenoid (not shown). Generally, the driver circuit 100 provides pulse-width modulation control (PWM) of the solenoid's winding 104.

The driver circuit 100 controllably connects the inductive load 102 to a source of electrical power ($+V_B$) in response to an input control signal. In the preferred embodiment, the inductive load 102 comprises the inductive winding of a solenoid 104. Advantageously, the driver circuit is adapted to provide pulse width modulated control (PWM) of the solenoid.

A power switching means 106 connects and disconnects the inductive load 102 to and from the source ($+V_B$) in response to a first control signal.

With reference to FIG. 2, the power switching means 106 includes first and second N-Channel MOSFETs 202,204. The source terminal of each of the first and second N-Channel MOSFETs 202,204 are connected together and also connected to the solenoid winding 104. The drain of each of the first and second N-Channel MOSFETs are also connected together. One end of a first resistor 206 is connected to the gate terminal of the first N-Channel MOSFET 202. One end of a second resistor 207 is connected to the gate terminal of the second N-Channel MOSFET 204. The other ends of the first and second resistors 206,207 are connected together.

Returning to FIG. 1, a flyback switching means 108 controllably provides a discharge path for a flyback current of the inductive load 102 in response to a second control signal. Generally, during energization of the winding 104, the flyback switching means 108 is said to be OFF and, thus, there is no flyback current path. However, when the winding 104 is disconnected from power source ($+V_{B1}$), the flyback switching means 108, as detailed below, provides a current path for the flyback current to prevent the occurrence of large voltage spikes.

With reference to FIG. 2, the flyback switching means 108 includes a third N-Channel MOSFET 208. The drain terminal of the third N-Channel MOSFET 208 is connected to the solenoid winding 104. The gate terminal of the third N-Channel MOSFET 208 is connected to the collector terminal of a first NPN transistor 210. The third N-Channel MOSFET 208 acts as a switch to controllably provide a flyback discharge path. During the flyback stage or interval, the MOSFET 208 provides the discharge path: first, thru the inherent drain-source diode, and second, thru the device's "ON" resistance which is in parallel with the diode.

The collector terminal of the first NPN transistor 210 is also connected to +VB$_{B3}$ via a third resistor 212. The emitter of the first NPN transistor 210 is connected to electrical ground.

A first diode 213 has an anode connected to electrical ground and a cathode connected to the base of the first NPN transistor 210.

A fourth resistor 214 and a first capacitor 216 are connected in parallel with one common end connected to the base of the first NPN transistor 210.

Returning again to FIG. 1, a first current sensing means 110 senses the current flowing through the power switching means 106 and delivers a first current signal having a magnitude proportional to the magnitude of the power switching means current.

The first current sensing means 110 includes a fifth resistor 218 connected between the drain terminal of the second N-Channel MOSFET 204 and the source of electrical power, V$_{B1}$. A first operational amplifier 220 has a positive input terminal connected to the junction between the fifth resistor 218 and the second N-Channel MOSFET 204. A negative input terminal of the first operational amplifier 220 is connected to the source terminal of a first P-Channel MOSFET 222. The source terminal of the first P-Channel MOSFET is connected to VB$_{B1}$ via a sixth resistor 224. The output of the first operational amplifier 220 is connected to the gate terminal of the first P-Channel MOSFET 222.

A second current sensing means 112 senses the flyback current of the inductive load 102 and produces a second current signal having a magnitude responsive to the magnitude of the flyback current. In the preferred embodiment, the second current sensing means 112 includes a seventh resistor 226 connected in the flyback current path. One end of the seventh resistor 226 is connected to the source of the third N-Channel MOSFET 208. The other end is connected to electrical ground.

A control means 114 receives the input control signal and the first and second current signals, responsively generates the first and second command signals, and responsively actuates the power switching means 106 and the flyback switching means 108 via the first and second command signals to provide non-overlap switching thereof.

The control means 114 includes a feedback amplifying means 116 for receiving the first and second current signals and responsively producing a feedback signal. In the preferred embodiment, the feedback amplifying means 116 includes a second operational amplifier 228. The negative and positive input terminals of the second operational amplifier 228 are connected to opposite ends of the seventh resistor 226 via eighth and ninth resistors 230, 232, respectively. A tenth resistor 234 connects the positive input terminal of the second operational amplifier 228 to electrical ground. A twenty-seventh resistor 236 connects the negative input terminal and output terminal of the second operational amplifier 228. The positive input terminal of the second operational amplifier 228 is also connected to the drain terminal of the first P-Channel MOSFET 222.

The control means 114 also includes an input means 118 for receiving the input control signal and the feedback signal and responsively generating a desired solenoid command signal. The input control signal is indicative of the desired solenoid actuation. In the preferred embodiment, the input means 118 includes a third operational amplifier 238. The positive input terminal of the third operational amplifier 238 is adapted to receive the input control signal. The negative input terminal is connected to the output terminal of the second operational amplifier 228 via an eleventh resistor 240. A twelfth resistor 242 is connected at one end to the output terminal of the third operational amplifier 238. A second capacitor 244 is connected between the output terminal and the negative input terminal of the third operational amplifier 238.

The control means 114 includes a waveform generating means 126 for generating a reference waveform. In the preferred embodiment, the waveform generator produces a triangle or sawtooth waveform.

The control means 114 further includes a comparing means 120 for receiving the desired solenoid command signal and said reference waveform, comparing the desired solenoid command signal and the reference waveform, and responsively producing an actual solenoid command signal.

In the preferred embodiment, the comparing means 120 includes a first comparator 246. The output terminal and the positive input terminal of the first comparator 246 are connected by a third capacitor 248. The positive input terminal is also connected to the other end of the twelfth resistor 242. The negative input terminal of the first comparator 246 is connected to the waveform generating means 126. The output terminal of the first comparator 246 is connected to +5 volts by a thirteenth resistor 250.

The control means 114 also further includes a signal generating means 122 for receiving the actual solenoid command signal and responsively generating the first and second command signals. In the preferred embodiment, the signal generating means 122 includes first and second inverters 252, 254 connected in series. The input of the first inverter 252 is connected to the output of the first comparator 246.

The output of the second inverter 254 is connected to a second diode 258 and a fourteenth resistor 260 connected in parallel. The opposite ends of the second diode 258 and fourteenth resistor 260 are connected to third and fourth inverters 264, 266 connected in series. The input to the third inverter 264 is connected to electrical ground via a fourth capacitor 262. The output of the fourth inverter 266 is connected to the junction between the fourth resistor 214 and the first capacitor 216.

The output of the second inverter 254 is connected to a third diode 268 and fifteenth resistor 270 connected in parallel. The opposite end of the third diode 268 and fifteenth resistor 270 are connected to the input of a fifth inverter 274. The input terminal to the fifth inverter 274 is connected to electrical ground through a fifth capacitor 272. The output of the fifth inverter 274 is connected to a sixth capacitor 276 and a sixteenth resistor 278 connected in parallel. The opposite ends of the sixth capacitor 276 and the sixteenth resistor 278 are connected to the base of a second NPN transistor 282. The emitter of the second NPN transistor 282 is connected to electrical ground. The base of the second NPN transistor 282 is connected to the cathode of a fourth diode 280. The anode of the fourth diode 280 is connected to electrical ground.

The output of the second inverter 254 is also connected to a fifth diode 284 and a seventeenth resistor 286 connected in parallel. The opposite ends of the fifth diode 284 and the seventeenth resistor 286 are connected to the input terminal of a sixth inverter 288. The input terminal of the sixth inverter 288 is also connected to electrical ground through a seventh capacitor 290. An eighth capacitor 292 connects the output terminal of the sixth inverter 288 to the base of a first PNP transistor 298. The collector of the first PNP transistor 298 is connected to the collector of the second NPN transistor 282. A sixth diode 294 and an eighteenth resistor 296 connected in parallel connect the emitter and the base of the first PNP transistor 298. The collector and emitter of the first PNP transistor 298 are connected by a nineteenth resistor 300. The collector of the first PNP transistor 298 and the collector of the second NPN transistor 282 are connected to the power switching means 106.

Additionally, the control means 114 includes a short circuit detecting means 124 for detecting a short circuit condition of the solenoid winding 104 and responsively producing a short circuit condition signal. The signal generating means 122 includes means for receiving said short circuit condition signal and responsively inhibiting actuation of said power switching means 106.

Returning to FIG. 2, in the preferred embodiment the short circuit detecting means 124 includes a second comparator 302. A twentieth resistor 304 connects the negative input terminal of the second comparator 302 to the first current sensing means 110. A twenty-first resistor 306 is connected at one end to the positive input terminal of the second comparator 302. A twenty-second resistor 308 is connected between the other end of the twenty-first resistor 306 and electrical ground. A twenty-third resistor 310 is connected between the other end of the twenty-first resistor 306 and +5 volts. A twenty-fourth resistor 312 is connected between the output of the second comparator 302 and +5 volts. A ninth capacitor 314 is connected between the output of the second comparator 302 and electrical ground.

The output of the second comparator 302 is connected to the positive input terminal of a third comparator 316. The output terminal of the third comparator 316 is connected to the positive input terminal by a tenth capacitor 322. The output terminal of the third comparator 316 is also connected to the input terminal of the first inverter 252. A twenty-fifth resistor 318 is connected between the negative input terminal of the third comparator 316 and +5 volts. A twenty-sixth resistor 320 is connected between the negative input terminal of the third comparator 316 and electrical ground.

INDUSTRIAL APPLICABILITY

With reference to the drawings and in operation, the present invention provides a driver circuit 100. The driver circuit is particularly applicable to drive the winding of a solenoid which positions a spool of an electronically controlled proportional hydraulic valve at a preselected position. The input control signal is a controllable input voltage which provides a reference voltage to the third operational amplifier 238. The input voltage is an indication of the desired position of the valve's spool. The driver circuit 100 uses pulse width modulation to maintain a current level in the winding 104 within prescribed limits of the desired current. In other words, the driver circuit 100 will energize the winding 104 at a set frequency, but in a single period will be ON for a determined period of time and OFF for a predetermined period of time. The ratio of ON time to OFF time is called the duty cycle.

Initially, no current is flowing in the winding 104; therefore, the feedback signal from the second operational amplifier 228 is zero. As a result, the control means biases the power switching means 106 and the flyback switching means 108 at a HIGH duty factor. The duty factor of the command signal is continually reduced as the current in the winding 104 increases, until such time as the current flowing though the second current sensing means 112 rises to the prescribed reference.

During the HIGH portions of the duty cycle, the power switching means is ON and the flyback switching means is OFF. That is, the first and second N-Channel MOSFETs are biased ON to connect the load and the power source ($V_{B1}$), allowing current to flow through the load. The flyback switching means is OFF, that is, the third N-Channel MOSFET 208 is OFF, appearing as an open circuit and eliminating the flyback current path.

During the LOW portions of the duty cycle, the power switching means is OFF and the flyback switching means is ON. That is, the first and second N-Channel MOSFETs are biased OFF to disconnect the load and the power source. The flyback switching means 108 is ON, that is, the third N-Channel MOSFET 208 is biased ON, allowing flyback current to flow from its source to its drain.

Other aspects, objects, and features of the present invention can be obtained from a study of the drawings, the disclosure, and the appended claims.

I claim:

1. A driver circuit for controllably connecting an inductive load to a source of electrical power in response to an input control signal, the inductive load having an inductive winding of a solenoid, comprising:

power switching means for connecting and disconnecting the inductive load to and from the source in response to a first command signal;

flyback switching means for controllably providing a discharge path for a flyback current of the inductive load in response to a second command signal;

first current sensing means for sensing a current flowing through only said power switching means and delivering a first current signal having a magnitude proportional to the magnitude of the power switching means current;

second current sensing means for sensing the flyback current of the inductive load and producing a second current signal having a magnitude responsive to the magnitude of said flyback current; and control means for receiving the input control signal and said first and second current signals, responsively generating said first and second command signals, and responsively actuating said power switching means and said flyback switching means via said first and second command signals to provide non-overlap switching thereof.

2. A driver circuit, as set forth in claim 1, wherein control means includes:

a feedback amplifying means for receiving said first and second current signals and responsively producing a feedback signal;

an input means for receiving the input control signal and said feedback signal, the input control signal being indicative of desired solenoid actuation and responsively generating a desired solenoid command signal;

waveform generating means for generating a reference waveform;

comparing means for receiving said desired solenoid command signal and said reference waveform, comparing said desired solenoid command signal and said reference waveform, and responsively producing an actual solenoid command signal; and signal generating means for receiving said actual solenoid command signal and responsively generating said first and second command signals.

3. A driver circuit, as set forth in claim 2, wherein said control means includes a short circuit detecting means for detecting a short circuit condition of the solenoid winding and responsively producing a short circuit condition signal and wherein said signal generating means includes means for receiving said short circuit condition signal and responsively inhibiting actuation of said power switching means.

4. A driver circuit for controllably connecting an inductive load to a source of electrical power in response to an input control signal, the inductive load having an inductive winding of a solenoid, comprising:

at least one MOSFET connected between the inductive load and the source of electrical power;

a second MOSFET connected in parallel with the inductive load and forming a flyback current discharge path;

first current sensing means for sensing a current flowing through only said at least one MOSFET and delivering a first current signal having a magnitude proportional to the magnitude of said current flowing through only said at least one MOSFET;

second current sensing means for sensing a flyback current flowing through said flyback current discharge path and producing a second current signal having a magnitude responsive to the magnitude of said flyback current; and control means for receiving the input control signal and said first and second current signals, and responsively actuating said at least one MOSFET and said second MOSFET to provide non-overlap switching thereof.

\* \* \* \* \*